(12) United States Patent
Lee

(10) Patent No.: US 10,186,685 B2
(45) Date of Patent: Jan. 22, 2019

(54) METHOD FOR MANUFACTURING LIGHT EXTRACTION SUBSTRATE FOR ORGANIC LIGHT EMITTING DIODE, LIGHT EXTRACTION SUBSTRATE FOR ORGANIC LIGHT EMITTING DIODE, AND ORGANIC LIGHT EMITTING DIODE COMPRISING SAME

(71) Applicant: Corning Precision Materials Co., Ltd., Chungcheongnam-do (KR)

(72) Inventor: Joo Young Lee, Chungcheongnam-do (KR)

(73) Assignee: Corning Precision Materials Co., Ltd. (KR)

( * ) Notice: Subject to any disclaimer, the term of this patent is extended or adjusted under 35 U.S.C. 154(b) by 0 days.

(21) Appl. No.: 15/539,884

(22) PCT Filed: Dec. 18, 2015

(86) PCT No.: PCT/KR2015/013901
§ 371 (c)(1),
(2) Date: Jun. 26, 2017

(87) PCT Pub. No.: WO2016/105026
PCT Pub. Date: Jun. 30, 2016

(65) Prior Publication Data
US 2017/0352841 A1  Dec. 7, 2017

(30) Foreign Application Priority Data

Dec. 24, 2014  (KR) .................. 10-2014-0188455

(51) Int. Cl.
*H01L 51/52* (2006.01)
*H01L 51/56* (2006.01)
*H01L 51/00* (2006.01)

(52) U.S. Cl.
CPC ...... *H01L 51/5268* (2013.01); *H01L 51/0096* (2013.01); *H01L 51/5203* (2013.01); *H01L 51/5275* (2013.01); *H01L 51/56* (2013.01)

(58) Field of Classification Search
CPC ............. H01L 51/5268; H01L 51/0096; H01L 51/5203; H01L 51/5275; H01L 51/56
See application file for complete search history.

(56) References Cited

U.S. PATENT DOCUMENTS

| 2010/0247740 | A1* | 9/2010 | Reitz ....................... C23C 24/00 427/8 |
| 2011/0198654 | A1 | 8/2011 | Naya |
| 2014/0048788 | A1 | 2/2014 | Lee et al. |
| 2015/0037539 | A1* | 2/2015 | Knoche ................... C03C 17/42 428/142 |
| 2016/0190357 | A1* | 6/2016 | Kawashima ............ G02B 1/111 136/256 |

FOREIGN PATENT DOCUMENTS

| JP | 2012064347 A | 3/2012 |
| JP | 2014022674 A | 2/2014 |

(Continued)

OTHER PUBLICATIONS

International Search Report for Application No. PCT/KR2015/013901 dated Apr. 19, 2016.

*Primary Examiner* — Matthew Reames
(74) *Attorney, Agent, or Firm* — Lerner, David, Littenberg, Krumholz & Mentlik, LLP

(57) ABSTRACT

The present invention relates to a method for manufacturing a light extraction substrate for an organic light emitting diode, a light extraction substrate for an organic light emitting diode, and an organic light emitting diode comprising same, and more specifically, to a method for manufacturing a light extraction substrate for an organic light (Continued)

emitting diode, a light extraction substrate for an organic light emitting diode, and an organic light emitting diode comprising same, capable of significantly increasing light extraction efficiency of the organic light emitting diode. To this end, provided in the present invention is the method for manufacturing the light extraction substrate for the organic light emitting diode, comprising: a mixture-preparing step of preparing a mixture by mixing a sol-gel solution containing a first metal oxide, and a plurality of scattering particles composed of a second metal oxide having a refractive index different from that of the first metal oxide; a mixture coating step of coating the mixture on a base substrate; a mixture firing step of firing the mixture which has been coated to form, on the base substrate, a matrix layer comprising the first metal oxide and inside of which the scattering particles are dispersed; and a filling layer forming step of forming a filling layer by filling the surface of the matrix layer with a material having a refractive index different from that of the matrix layer, wherein the filling layer fills cracks formed on the matrix layer when firing the mixture, and wherein corrugation is formed on the surface of the filling layer by the scattering particles and the shape of the cracks which is transferred onto the surface of the filling layer.

8 Claims, 5 Drawing Sheets

(56) References Cited

FOREIGN PATENT DOCUMENTS

| KR | 20100009527 A | 1/2010 |
| KR | 20110084198 A | 7/2011 |
| KR | 101093259 B1 | 12/2011 |
| KR | 101114917 B1 | 2/2012 |

* cited by examiner

METHOD FOR MANUFACTURING LIGHT EXTRACTION SUBSTRATE FOR ORGANIC LIGHT EMITTING DIODE, LIGHT EXTRACTION SUBSTRATE FOR ORGANIC LIGHT EMITTING DIODE, AND ORGANIC LIGHT EMITTING DIODE COMPRISING SAME

CROSS-REFERENCE TO RELATED APPLICATION

This application is a national phase entry under 35 U.S.C. § 371 of International Application No. PCT/KR2015/013901, filed on Dec. 18, 2015, published in Korean, which claims priority to Korean Patent Application No. 10-2014-0188455, filed on Dec. 24, 2014, the disclosures of which are incorporated herein by reference.

TECHNICAL FIELD

The present disclosure relates to a method of manufacturing a light extraction substrate for an organic light-emitting diode (OLED), a light extraction substrate for an OLED, and an OLED device including the same. More particularly, the present disclosure relates to a method of manufacturing a light extraction substrate for an OLED, wherein the method can significantly improve the light extraction efficiency of an OLED by reducing a waveguide effect, regarded as a most significant cause of loss in the efficiency of the OLED, and reducing a surface plasmon effect, a light extraction substrate for an OLED, and an OLED device including the same.

BACKGROUND ART

In general, light-emitting devices may be divided into organic light-emitting diode (OLED) devices having a light-emitting layer formed from an organic material and inorganic light-emitting devices having a light-emitting layer formed from an inorganic material. In OLED devices, OLEDs are self-emitting light sources based on the radiative decay of excitons generated in an organic light-emitting layer by the recombination of electrons injected through an electron injection electrode (cathode) and holes injected through a hole injection electrode (anode). OLEDs have a range of merits, such as low-voltage driving, self-emission of light, wide viewing angles, high resolution, natural color reproducibility, and rapid response times.

Recently, research has been actively undertaken into applying OLEDs to portable information devices, cameras, clocks, watches, office equipment, information display devices for vehicles or similar, televisions (TVs), display devices, lighting systems, and the like.

To improve the luminous efficiency of such above-described OLED devices, it is necessary to improve the luminous efficiency of a material of which a light-emitting layer is formed or light extraction efficiency, i.e. the efficiency with which light generated by the light-emitting layer is extracted.

The light extraction efficiency of an OLED device depends on the refractive indices of OLED layers. In a typical OLED device, when a beam of light generated by the light-emitting layer is emitted at an angle greater than a critical angle, the beam of light may be totally reflected at the interface between a higher-refractivity layer, such as a transparent electrode layer functioning as an anode, and a lower-refractivity layer, such as a glass substrate. This may consequently lower light extraction efficiency, thereby lowering the overall luminous efficiency of the OLED device, which is problematic.

Described in more detail, only about 20% of light generated by an OLED is emitted from the OLED device and about 80% of the light generated is lost due to a waveguide effect originating from different refractive indices of a glass substrate, an anode, and an organic light-emitting layer comprised of a hole injection layer, a hole transport layer, an emissive layer, an electron transport layer, and an electron injection layer, as well as by the total internal reflection originating from the difference in refractive indices between the glass substrate and ambient air. Here, the refractive index of the internal organic light-emitting layer ranges from 1.7 to 1.8, whereas the refractive index of indium tin oxide (ITO), generally used in anodes, is about 1.9. Since the two layers have a significantly low thickness, ranging from 200 nm to 400 nm, and the refractive index of the glass used for the glass substrate is about 1.5, a planar waveguide is thereby formed inside the OLED device. It is calculated that the ratio of the light lost in the internal waveguide mode due to the above-described reason is about 45%. In addition, since the refractive index of the glass substrate is about 1.5 and the refractive index of ambient air is 1.0, when light exits the interior of the glass substrate, a beam of the light, having an angle of incidence greater than a critical angle, may be totally reflected and trapped inside the glass substrate. The ratio of trapped light is about 35%. Therefore, only about 20% of generated light may be emitted from the OLED device.

To overcome such problems, light extraction layers, through which 80% of light that would otherwise be lost in the internal waveguide mode can be extracted, have been actively researched. Light extraction layers are generally categorized as internal light extraction layers and external light extraction layers. In the case of external light extraction layers, it is possible to improve light extraction efficiency by disposing a film including microlenses on the outer surface of the substrate, the shape of the microlenses being selected from among a variety of shapes. The improvement of light extraction efficiency does not significantly depend on the shape of microlenses. On the other hand, internal light extraction layers directly extract light that would otherwise be lost in the light waveguide mode. Thus, the capability of internal light extraction layers to improve light extraction efficiency may be higher than that of external light extraction layers.

However, the effect of improving light extraction efficiency using the internal light extraction layer is still insignificant with respect to the amount of outwardly emitted light. Therefore, active research into a method or technology for further improving light extraction efficiency is in demand.

RELATED ART DOCUMENT

Korean Patent No. 1093259 (Dec. 6, 2011)

DISCLOSURE

Technical Problem

Accordingly, the present disclosure has been made in consideration of the above-described problems occurring in the related art, and the present disclosure proposes a method of manufacturing a light extraction substrate of an organic light-emitting diode (OLED), wherein the method can significantly improve the light extraction efficiency of an OLED by reducing a waveguide effect, regarded as a most significant cause of loss in the efficiency of the OLED, and reducing a surface plasmon effect, a light extraction substrate for an OLED, and an OLED device including the same.

Technical Solution

According to an aspect of the present disclosure, a method of manufacturing a light extraction substrate for an OLED may include: preparing a mixture by mixing a sol-gel solution containing a first metal oxide and a number of scattering particles formed from a second metal oxide having a refractive index different from a refractive index of the first metal oxide; coating a base substrate with the mixture; firing the mixture coating the base substrate to form a matrix layer on the base substrate, the matrix layer being formed from the first metal oxide and having the number of scattering particles dispersed therein; and forming a filler layer on a surface of the matrix layer by applying a material having a refractive index different from a refractive index of the matrix layer. The filler layer fills cracks created in the matrix layer during the firing of the mixture, and shapes of the number of scattering particles and the cracks are transferred to a surface of the filler layer.

A surface roughness of the filler layer may be lower than a surface roughness of the matrix layer.

In the preparation of the mixture, a concentration of the sol-gel solution may be controlled to be 0.5M or higher.

In the preparation of the mixture, the first metal oxide may be one metal oxide or a combination of two or more metal oxides selected from a candidate group consisting of $SiO_2$, $TiO_2$, $ZrO_2$, $ZnO_2$, and $SnO_2$.

In the preparation of the mixture, the second metal oxide may be one metal oxide or a combination of two or more metal oxides selected from a candidate group consisting of $SiO_2$, $TiO_2$, $ZnO_2$, and $SnO_2$.

In the preparation of the mixture, at least portions of the number of scattering particles respectively include a hollow core and a shell surrounding the core.

The mixture may be fired at a temperature of 400° C. to 800° C.

In the firing of the mixture, a number of irregularly shaped voids may be formed within the matrix layer.

Sizes of the number of irregularly shaped voids may range from 50 nm to 900 nm.

According to another aspect of the present disclosure, a light extraction substrate for an OLED may include: a base substrate; a matrix layer disposed on the base substrate and formed from a first metal oxide; a number of scattering particles dispersed in the matrix layer and formed from a second metal oxide having a refractive index different from a refractive index of the first metal oxide; and a filler layer applied to a surface of the matrix layer.

The matrix layer may have cracks created therein, the cracks scattering light emitted by an OLED. The filler layer may fill the cracks. The filler layer may have surface corrugations having shapes transferred from shapes of the number of scattering particles and the cracks.

A surface roughness of the filler layer may be lower than a surface roughness of the matrix layer.

The matrix layer may be formed from one metal oxide or a combination of two or more metal oxides selected from a candidate group consisting of $SiO_2$, $TiO_2$, $ZrO_2$, $ZnO_2$, and $SnO_2$.

The number of scattering particles may be formed from one metal oxide or a combination of two or more metal oxides selected from a candidate group consisting of $SiO_2$, $TiO_2$, $ZnO_2$, and $SnO_2$.

At least portions of the number of scattering particles may respectively be comprised of a hollow core and a shell surrounding the core.

The light extraction substrate may further include a number of irregularly shaped voids formed within the matrix layer.

In this case, sizes of the number of irregularly shaped voids may range from 50 nm to 900 nm.

An area of the number of voids in the matrix layer may range from 2.5% to 10.8% of an area of the matrix layer.

A haze value of the matrix layer may range from 60% to 90%.

The cracks may be located between scattering particles among the number of scattering particles or between clusters of scattering particles among the number of scattering particles.

At least portions of the cracks may expose the base substrate to a surface of the matrix layer.

According to another aspect of the present disclosure, an OLED device may include: a cathode; an organic light-emitting layer disposed on the cathode; and an anode disposed on the organic light-emitting layer. The light extraction substrate may be disposed on the anode. The matrix layer, the number of scattering particles, and the filler layer of the light extraction substrate may form an internal light extraction layer. The anode, the organic light-emitting layer, and the cathode may have corrugated structures due to the surface corrugations of the filler layer sequentially transferred thereto.

Advantageous Effects

According to the present disclosure, a light extraction substrate has a corrugated structure formed in the surface thereof that abuts an OLED, the corrugated structure being transferred to the OLED including a cathode, a reflecting electrode of the OLED. This can reduce a waveguide effect, regarded as a most significant cause of loss in the efficiency of the OLED, and reducing a surface plasmon effect, thereby significantly improving the light extraction efficiency of an OLED device.

MODE FOR INVENTION

Hereinafter, a light extraction substrate for an organic light-emitting diode (OLED), a light extraction substrate for an OLED, and an OLED device including the same according to exemplary embodiments will be described in detail with reference to the accompanying drawings.

In the following disclosure, detailed descriptions of known functions and components incorporated in the present disclosure will be omitted in the case that the subject matter of the present disclosure may be rendered unclear by the inclusion thereof.

Figure 1:
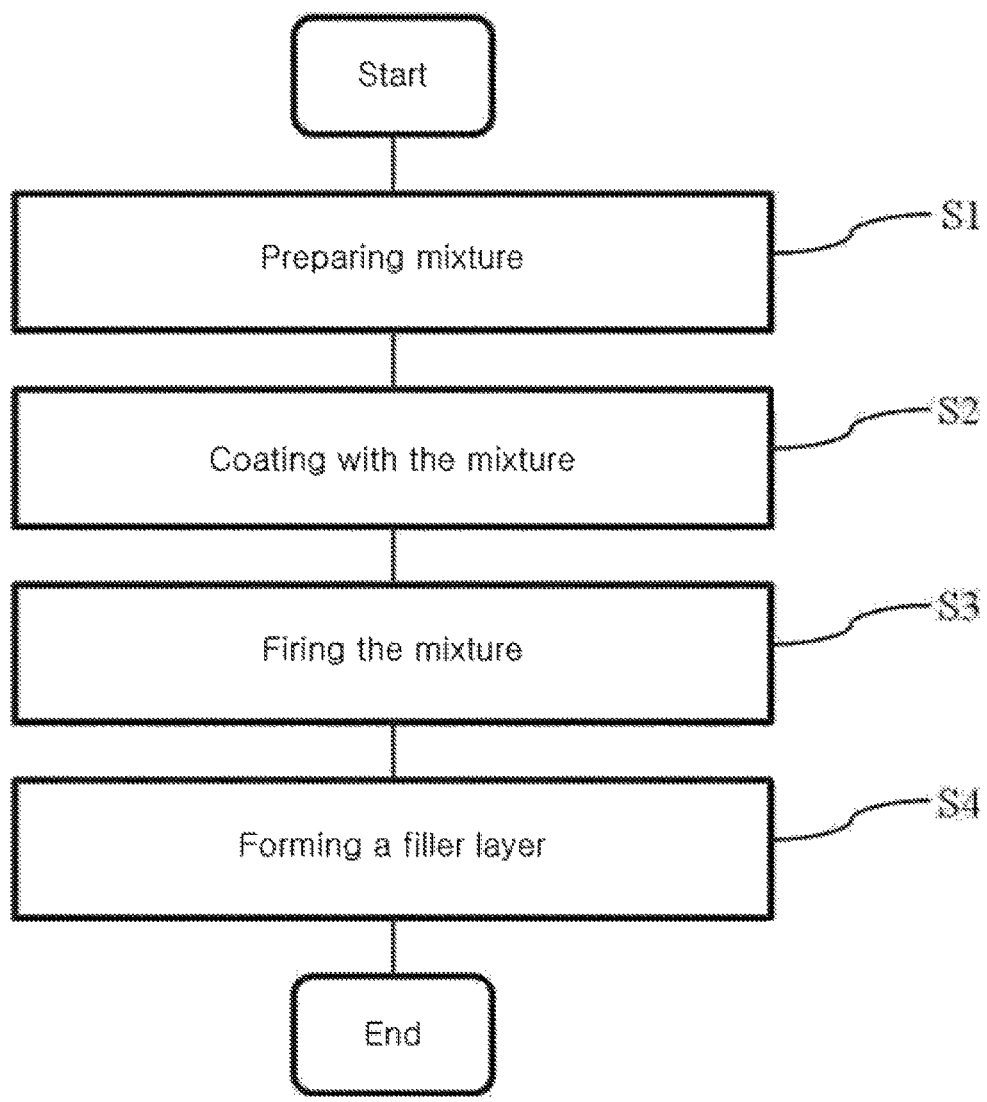
FIG. 1 is a process flowchart illustrating a method of manufacturing a light extraction substrate for an OLED according to an exemplary embodiment.

As illustrated in FIG. 1, a method of manufacturing a light extraction substrate for an OLED according to an exemplary embodiment is a method of manufacturing a light extraction substrate (100 in FIG. 6) disposed on a path, along which light emitted by an OLED (10 in FIG. 6) exits, to function as a route on which light emitted by the OLED (10 in FIG. 6) exits, improve the light extraction efficiency of the OLED (10 in FIG. 6), and protect the OLED (10 in FIG. 6) from the external environment.

As illustrated in FIG. 1, the method of manufacturing a light extraction substrate for an OLED according to the exemplary embodiment includes a mixture preparation step S1, a mixture coating step S2, a mixture firing step S3, and a filler layer forming step S4.

First, the mixture preparation step S1 is a step of preparing a mixture (120 in FIG. 2) for formation of an internal light extraction layer of the OLED 10. In the mixture preparation step S1 according to the exemplary embodiment, the mixture 120 is prepared by mixing a number of scattering particles (122 in FIG. 2) with a sol-gel solution (121 in FIG. 2). In the mixture preparation step S1, the sol-gel solution 121 containing a first metal oxide may be used. For example, the first metal oxide may be one metal oxide or a combination of two or more metal oxides selected from a candidate group consisting of SiO2, TiO2, ZrO2, ZnO2, and SnO2. In addition, the number of scattering particles 122 formed from a second metal oxide, the refractive index of which is different from that of the first metal oxide, may be used in the mixture preparation step S1. For example, the second metal oxide may be one metal oxide or a combination of two or more metal oxides selected from a candidate group consisting of SiO2, TiO2, ZnO2, and SnO2. In the mixture preparation step S1, scattering particles respectively comprised of a hollow core (123 in FIG. 2) and a shell (124 in FIG. 2) surrounding the core may be used as the number of scattering particles 122. In addition, in the mixture preparation step S1, the scattering particles having the core-shell structure may be used to form at least portions of the number of scattering particles 122 to be mixed with the sol-gel solution. That is, in the mixture preparation step S1, the number of scattering particles 122 to be mixed with the sol-gel solution 121 may be prepared by mixing scattering particles without hollow inner portions and the scattering particles respectively having the core-shell structure at a predetermined ratio. In addition, in the mixture preparation step S1, only the scattering particles without hollow inner portions may be used as the number of scattering particles 122. As described above, the number of scattering particles 122, able to have a variety of combinations, serve to scatter light emitted by the OLED 10 along a variety of paths, thereby improving the light extraction efficiency of the OLED 10. In particular, when the scattering particles 122 have the core-shell structure comprised of the core 123 and the shell 124, the difference in refractive indices between the core 123 and the shell can further improve light extraction efficiency of light emitted by the OLED 10.

In the mixture preparation step S1 according to the exemplary embodiment, the concentration of the sol-gel solution 121 may be controlled to be 0.5M or higher, so that the cracks (131 in FIG. 4) are created in a matrix layer (130 in FIG. 4) formed by the firing of the sol-gel solution 121 in the subsequent mixture firing step S3, due to the difference in coefficients of thermal expansion (CTE) between the base substrate (110 in FIG. 2) and the first metal oxide contained in the sol-gel solution 121.

Figure 2:
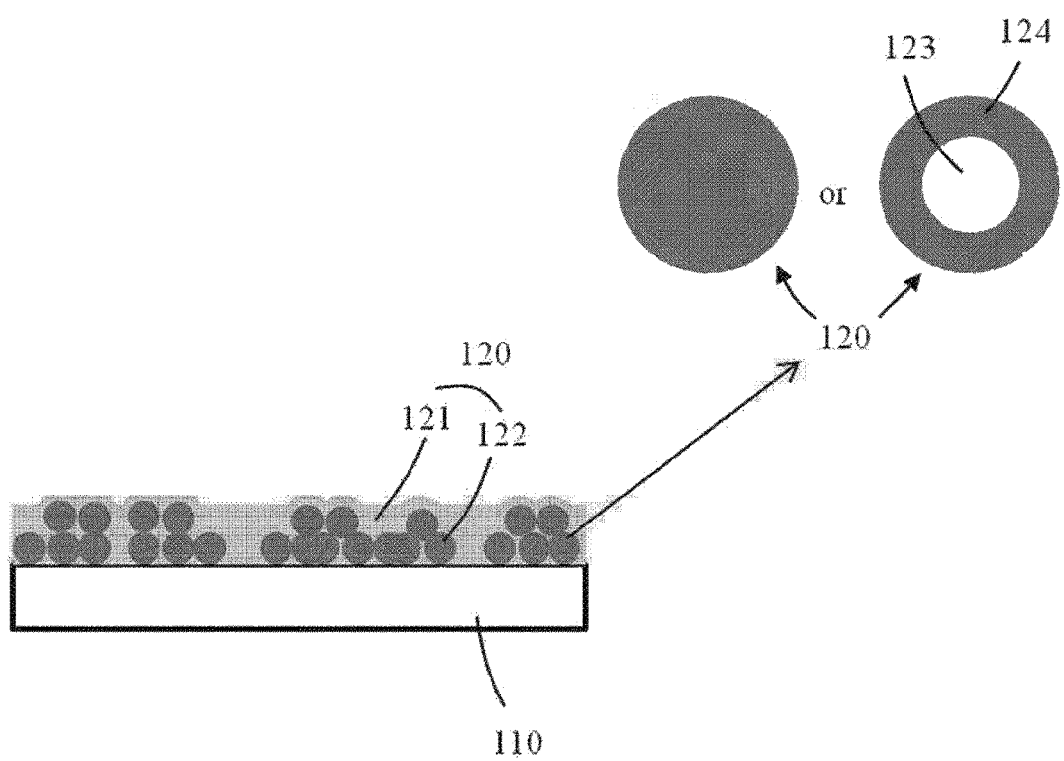
FIGS. 2 to 5 sequentially illustrate process steps of the method of manufacturing a light extraction substrate for an OLED according to the exemplary embodiment.

Subsequently, as illustrated in FIG. 2, the mixture coating step S2 is a step of coating the top surface of the base substrate 110 with the mixture 120 prepared in the mixture preparation step S1. Here, the mixture 120 may be applied to the base substrate 110 at a thickness equal to or higher than the thickness of the scattering particles 122 in the mixture coating step S2, so that the cracks (131 in FIG. 4) are created in the matrix layer (130 in FIG. 4) formed by the firing of the sol-gel solution 121 in the subsequent mixture firing step S3, due to the difference in CTE between the base substrate 110 and the first metal oxide contained in the sol-gel solution 121. When several scattering particles of the number of scattering particles 122 are clustered into two layers, the thickness of the scattering particles 122 includes the total thickness of the scattering particles clustered in two layers.

In other words, to form the cracks (131 in FIG. 4) in the matrix layer 130, it is necessary to control the concentration of the sol-gel solution 121 in the mixture preparation step S1 and to control the thickness of the mixture 120 in the mixture coating step S2.

When the light extraction substrate (100 in FIG. 5) manufactured according to the exemplary embodiment is used in an OLED device including the OLED (10 in FIG. 6), the base substrate 110 coated with the mixture 120 is disposed on a front portion of the OLED 10, i.e. a portion in which light generated by the OLED 10 contacts the ambient air, to allow the light to exit while functioning as an encapsulation substrate to protect the OLED 10 from the external environment. The base substrate 110 may be any transparent substrate having superior light transmittance and excellent mechanical properties. For example, the base substrate 110 may be formed from a polymeric material, such as a thermally or ultraviolet (UV) curable organic film. Alternatively, the base substrate 110 may be formed from chemically strengthened glass, such as soda-lime glass (SiO2-CaO—Na2O) or aluminosilicate glass (SiO2-Al2O3-Na2O). When the OLED device including the light extraction substrate 100 according to the exemplary embodiment is used in lighting equipment, the base substrate 110 may be formed from soda-lime glass. The base substrate 110 may also be a substrate formed from a metal oxide or a metal nitride. The base substrate 110 according to the exemplary embodiment may be a thin glass sheet having a thickness of 1.5 mm or less. The thin glass sheet may be manufactured using a fusion process or a floating process.

Figure 3:
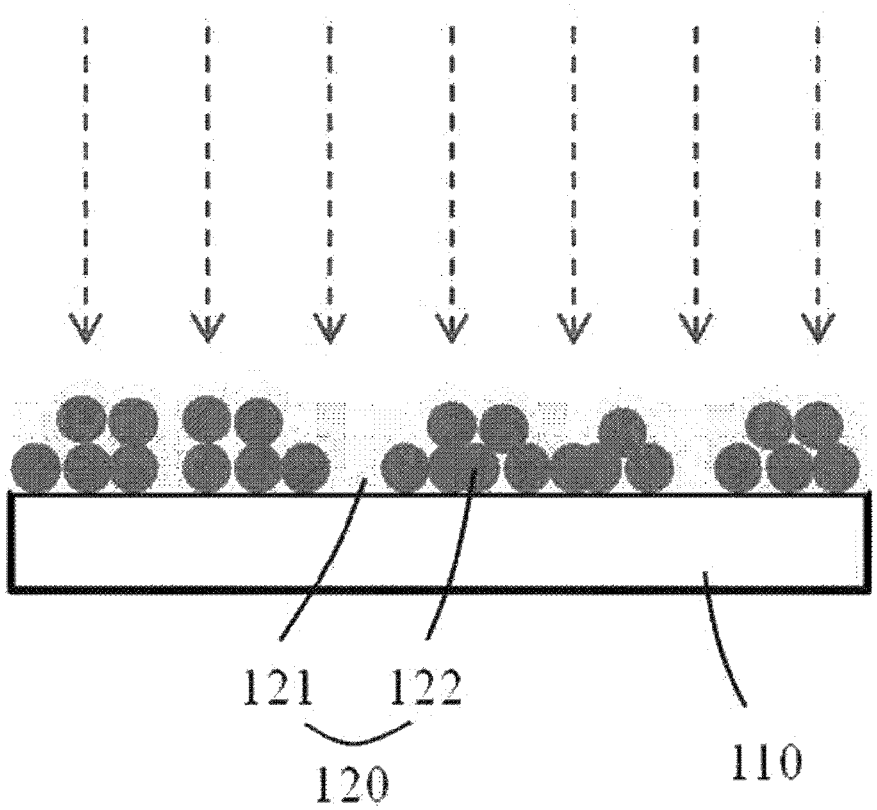

Subsequently, as illustrated in FIG. 3, the mixture firing step S3 is a step of firing the mixture 120 applied to the base substrate 110 in the mixture coating step S2. In addition, the mixture firing step S3 forms the matrix layer (130 in FIG. 4) having the number of scattering particles 122 dispersed therein on the base substrate 110 by firing the mixture 120. Here, the matrix layer 130 is formed from the first metal oxide, whereas each of the number of scattering particles 122 is formed from the second metal oxide, the refractive index of which is different from that of the first metal oxide.

Figure 4:
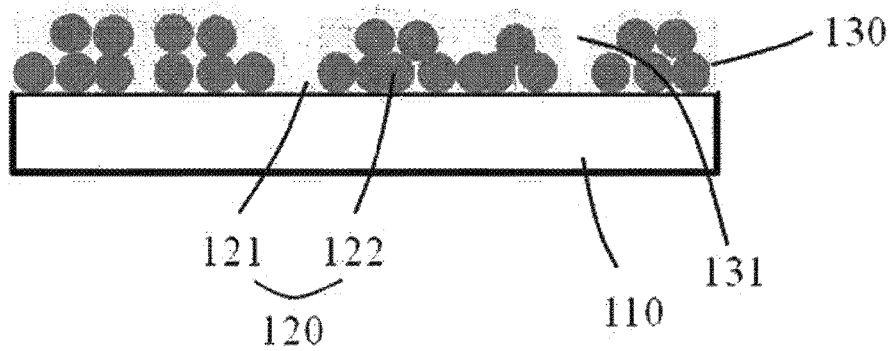

In the mixture firing step S3 according to the exemplary embodiment, the mixture 120 is fired at a temperature of 400° C. to 800° C. When the mixture 120 is fired in this temperature range, as illustrated in FIG. 4, the cracks 131 able to scatter light emitted by the OLED (10 in FIG. 6) are formed in the matrix layer 130. That is, the cracks 131 can further complicate or diversify paths for light emitted by the OLED 10. The cracks 131 formed in the matrix layer 130 extend in the direction from the surface of the matrix layer 130 toward the base substrate 110. Here, portions or all of the cracks 131 may be formed such that the base substrate 110 can be exposed to the surface of the matrix layer 130. In addition, the cracks 131 may be formed between scattering particles among the number of scattering particles 122 or between the clusters of several scattering particles among the number of scattering particles 122.

The cracks are induced in the process of firing the mixture in the mixture firing step S3, due to the difference in CTE between the base substrate 110 and the first metal oxide contained in the sol-gel solution 121. Here, the control over the concentration of the sol-gel solution 121 in the mixture preparation step S1 and the control over the thickness of the mixture 120 in the mixture coating step S2 act as factors of substantially creating or promoting the cracks 131 induced due to the CTE difference. Specifically, when the concentration of the sol-gel solution 121 is controlled in the mixture preparation step S1 and the coating thickness of the mixture 120 is controlled in the mixture coating step S2, the degree of the cracks 131 created in the matrix layer 130 due to the difference in CTE between the base substrate 110 and the first metal oxide of the sol-gel solution 121 can be controlled.

In the mixture firing step S3, a number of irregularly shaped voids (not shown) are formed in sizes of, for example, 50 nm to 900 nm, within the matrix layer 130 during the firing of the mixture 120. When the matrix layer 130 manufactured according to the exemplary embodiment, for example, the matrix layer 130 in which the number of scattering particles 122 having the core-shell structure comprised of the core 123 and the shell 124 are dispersed in a single layer, has a haze value of 60%, the area of the number of voids (not shown) formed within the matrix layer 130 may range from 2.5% to 10.8% of the area of the matrix layer 130. Like the scattering particles 122 and the cracks 131, the number of voids (not shown) scatter light emitted by the OLED along a variety of paths, thereby contributing to improvements in the light extraction efficiency of the OLED 10. In this case, the light extraction efficiency may increase with increases in the area of the number of voids (not shown) formed within the matrix layer 130.

The surface of the matrix layer 130, created through the mixture firing step S3 as described above, has a corrugated structure, since the shapes of the scattering particles 122 and the cracks 131, created therein, are transferred to the surface of the matrix layer 130.

Figure 5:
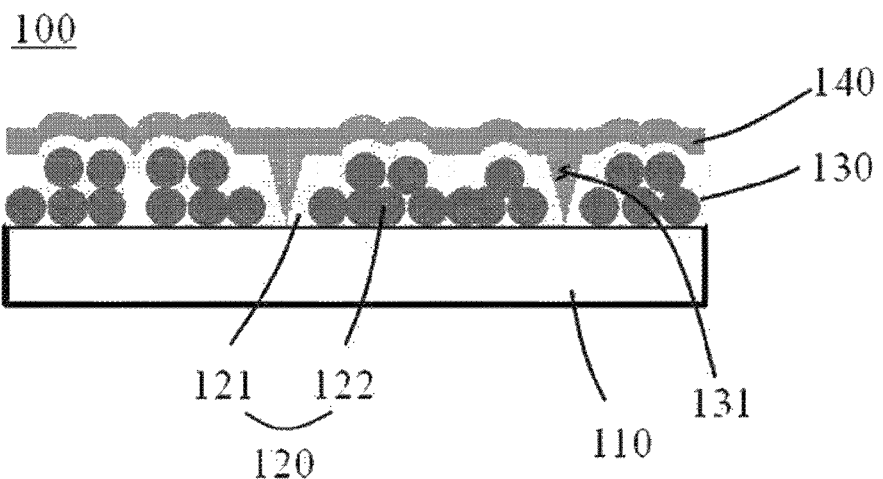

Subsequently, as illustrated in FIG. 5, the filler layer forming step S4 is a step of forming a filler layer 140 on the surface of the matrix layer 130 by applying a material, the refractive index of which is different from that of the matrix layer 130, to the surface of the matrix layer 130. In the filler layer forming step S4, the filler layer 140 may be formed by applying a sol-gel solution or high-refractive-index hybrimer containing a high-refractive-index inorganic material to the surface of the matrix layer 130.

When the filler layer 140 is formed as described above, the filler layer 140 fills the cracks 131 created in the matrix layer 130 during the firing of the mixture 120, thereby effectively preventing the OLED 10 from becoming defective in response to an abrupt change in the surface roughness of the matrix layer 130 having the number of cracks 131. Here, the shapes of the number of scattering particles 122 and the number of cracks 131 are transferred to the surface of the filler layer 140, thereby forming corrugations thereon.

The corrugations of the filler layer 140 are smoother than the corrugated structure formed on the surface of the matrix layer 130. Since the filler layer 140 serves to reduce the surface roughness of the matrix layer 130, the surface roughness of the filler layer 140 is lower than that of the matrix layer 130. The surface corrugations of the filler layer 140 induce an abrupt change in the refractive index, provide excellent scattering characteristics for light emitted by the OLED 10, and are transferred to the surface of a cathode (13 in FIG. 6), a reflecting electrode, of the OLED. Due to the surface corrugations of the filler layer 140 as described above, corrugations are induced to an anode (11 in FIG. 6), an organic light-emitting layer (12 in FIG. 6), and the cathode (13 in FIG. 6) that are sequentially stacked on the filler layer 140, a surface plasmon effect can be reduced. When both the waveguide effect and the surface plasmon effect are reduced, the light extraction efficiency of the OLED (10 in FIG. 6) can be significantly improved.

When the filler layer forming step S4 is completed, the light extraction substrate 100 for an OLED according to the exemplary embodiment is manufactured.

Figure 6:
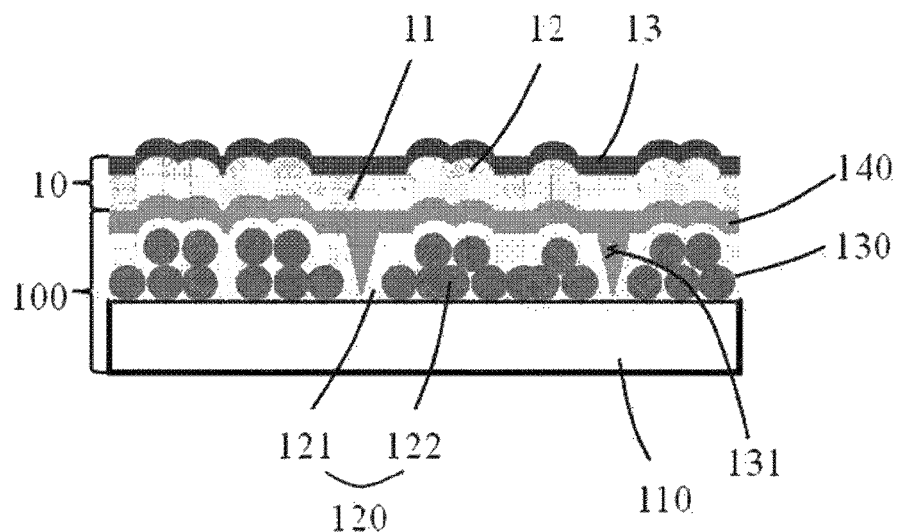
FIG. 6 is a cross-sectional view illustrating an application in which a light extraction substrate for an OLED manufactured according to the exemplary embodiment is used in an OLED device.

As illustrated in FIG. 6, the light extraction substrate 100 manufactured using the above-described process is disposed on a portion of the OLED 10, through which light emitted by the OLED exits, to function as an optical functional substrate to improve light extraction efficiency of the OLED 10. Here, the matrix layer 130 having the cracks 131, the number of scattering particles 122 and the number of voids (not shown) dispersed within the matrix layer 130, and the filler layer 140 having the corrugated structure form an internal light extraction layer of the OLED device including the OLED 10. The internal light extraction layer can cause light emitted by the OLED 10 to be sharply refracted and diversify scattering paths for the light using the filler layer 140 having the corrugated structure, thereby improving the light extraction efficiency of the OLED 10. In addition, to the corrugated structure of the filler layer 140, the internal light extraction layer has the complicated scattering structure realized by the cracks 131, the matrix layer 130, the number of scattering particles 122, and the number of voids (not shown). Due to these structures, the internal light extraction layer can significantly improve the light extraction efficiency of the OLED 10.

The OLED 10 has a multilayer structure comprised of the anode 11, the organic light-emitting layer 12, and the cathode 13, sandwiched between the light extraction substrate 100 according to the exemplary embodiment and another substrate (not shown) facing the light extraction substrate 100 to encapsulate the OLED. The anode 11 abuts the filler layer 140 of the light extraction substrate 100 according to the exemplary embodiment. Thus, the surface corrugated structure of the filler layer 140 is sequentially transferred to the anode 11, the organic light-emitting layer 12, and the cathode. The corrugated structure, transferred to the multilayer structure including the cathode 13, not only can reduce the waveguide effect based on the scattering effect, but also can reduce the surface plasmon effect, thereby significantly improving the light extraction efficiency of the OLED device including the OLED 10.

The anode 11 may be formed from a metal or metal oxide having a greater work function, such as Au, In, Sn, or indium tin oxide (ITO), to facilitate hole injection. The cathode may be a metal thin film formed from Al, Al:Li, or Mg:Ag that has a smaller work function to facilitate electron injection. Although not specifically illustrated, the organic light-emitting layer 12 may include a hole injection layer, a hole transport layer, an emissive layer, an electron transport layer, and an electron injection layer that are sequentially stacked on the anode 11.

According to this structure, when a forward voltage is induced between the anode 11 and the cathode 13, electrons migrate from the cathode 13 to the emissive layer through the electron injection layer and the electron transport layer, while holes migrate from the anode 11 to the emissive layer through the hole injection layer and the hole transport layer. The electrons and the holes that have migrated into the emissive layer recombine with each other, thereby generating excitons. When these excitons transit from an excited state to a ground state, light is generated. The brightness of the generated light is proportional to the amount of current flowing between the anode 11 and the cathode 13.

When the OLED 11 is a white OLED used for lighting, the light-emitting layer may have, for example, a multilayer structure comprised of a high-molecular light-emitting layer that emits blue light and a low-molecular light-emitting layer that emits orange-red light. In addition, a variety of other structures that emit white light may be used.

According to the exemplary embodiment, the organic light-emitting layer 12 may also have a tandem structure. In this case, a plurality of organic light-emitting layers 12 alternating with interconnecting layers (not shown) may be provided.

Example 1

Figure 7:
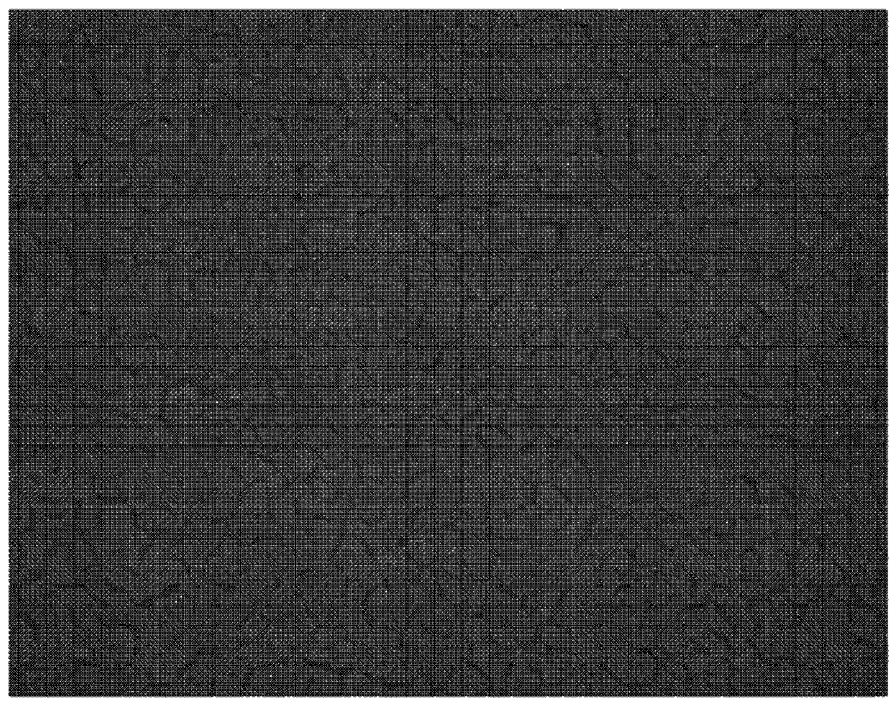
FIGS. 7 and 8 are electron microscope images illustrating surfaces of light extraction substrates manufactured according to Examples 1 and 2 of the present disclosure.

SiO2 particles having diameters of 600 nm were mixed with a 0.65M TiO2 sol-gel solution, and then a substrate was coated with the resultant mixture. The mixture was then dried at 100° C. for minutes, followed by firing at 500° C. for 30 minutes. Afterwards, a high-refractive-index filler layer was formed on the fired mixture. FIG. 7 is an electron microscope image illustrating the surface of the filler layer. Cracks formed in the surface of the filler layer can be visually detected. Subsequently, light extraction efficiency of an OLED was simulated by applying the sample to the OLED. The simulated light extraction efficiency was about 1.7 times the light extraction efficiency of an OLED without a light extraction layer.

Example 2

Figure 8:
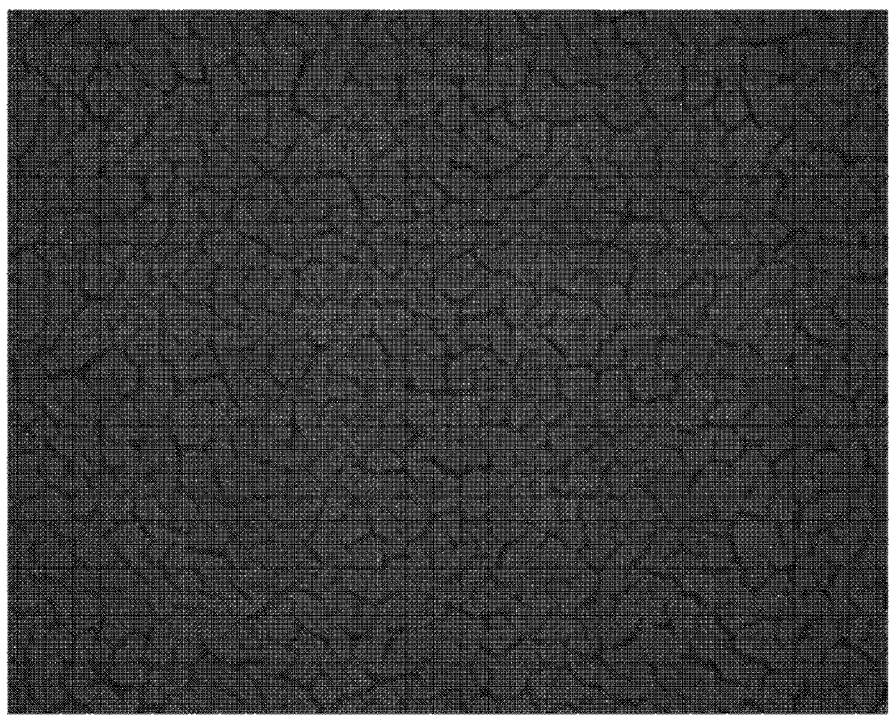

SiO2 particles having diameters of 600 nm were mixed with a 1.5M TiO2 sol-gel solution, and then a substrate was coated with the resultant mixture. The mixture was then dried at 100° C. for minutes, followed by firing at 500° C. for 30 minutes. Afterwards, a high-refractive-index filler layer was formed on the fired mixture. FIG. 8 is an electron microscope image illustrating the surface of the filler layer. Cracks formed in the surface of the filler layer can be visually detected. Thus, light extraction efficiency equal or equivalent to that of Example 1 can be expected.

The foregoing descriptions of specific exemplary embodiments of the present disclosure have been presented with respect to the drawings and are not intended to be exhaustive or to limit the present disclosure to the precise forms disclosed, and obviously many modifications and variations are possible for a person having ordinary skill in the art in light of the above teachings.

It is intended therefore that the scope of the present disclosure not be limited to the foregoing embodiments, but be defined by the Claims appended hereto and their equivalents.

The invention claimed is:

1. A method of manufacturing a light extraction substrate for an organic light-emitting diode, the method comprising:
   preparing a mixture by mixing a sol-gel solution containing a first metal oxide and a number of scattering particles formed from a second metal oxide having a refractive index different from a refractive index of the first metal oxide;
   coating a base substrate with the mixture;
   firing the mixture coating the base substrate to form a matrix layer on the base substrate, the matrix layer being formed from the first metal oxide and having the number of scattering particles dispersed therein; and
   forming a filler layer on a surface of the matrix layer by applying a material having a refractive index different from a refractive index of the matrix layer,
   wherein the filler layer fills cracks created in the matrix layer during the firing of the mixture, and shapes of the number of scattering particles and the cracks are transferred to a surface of the filler layer.

2. The method of claim 1, wherein a surface roughness of the filler layer is lower than a surface roughness of the matrix layer.

3. The method of claim 1, wherein, in preparing the mixture, a concentration of the sol-gel solution is controlled to be 0.5M or higher.

4. The method of claim 1, wherein, in preparing the mixture, the first metal oxide comprises one metal oxide or a combination of two or more metal oxides selected from a candidate group consisting of $SiO_2$, $TiO_2$, $ZrO_2$, $ZnO_2$, and $SnO_2$.

5. The method of claim 1, wherein, in preparing the mixture, the second metal oxide comprises one metal oxide or a combination of two or more metal oxides selected from a candidate group consisting of $SiO_2$, $TiO_2$, $ZnO_2$, and $SnO_2$.

6. The method of claim 1, wherein the mixture is fired at a temperature of 400° C. to 800° C.

7. The method of claim 1, wherein, in firing the mixture, a number of irregularly shaped voids are formed within the matrix layer.

8. The method of claim 7, wherein sizes of the number of irregularly shaped voids range from 50 nm to 900 nm.

* * * * *